United States Patent
Biebersdorf et al.

(10) Patent No.: US 11,915,935 B2
(45) Date of Patent: Feb. 27, 2024

(54) METHOD FOR PRODUCING A SEMICONDUCTOR COMPONENT COMPRISING PERFORMING A PLASMA TREATMENT, AND SEMICONDUCTOR COMPONENT

(71) Applicant: OSRAM Opto Semiconductors GmbH, Regensburg (DE)

(72) Inventors: Andreas Biebersdorf, Regensburg (DE); Stefan Illek, Donaustauf (DE); Christoph Klemp, Regensburg (DE); Ines Pietzonka, Donaustauf (DE); Petrus Sundgren, Lappersdorf (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 321 days.

(21) Appl. No.: 17/282,519

(22) PCT Filed: Oct. 2, 2019

(86) PCT No.: PCT/EP2019/076733
§ 371 (c)(1),
(2) Date: Apr. 2, 2021

(87) PCT Pub. No.: WO2020/070202
PCT Pub. Date: Apr. 9, 2020

(65) Prior Publication Data
US 2021/0351037 A1    Nov. 11, 2021

(30) Foreign Application Priority Data
Oct. 5, 2018  (DE) .................... 10 2018 124 576.9

(51) Int. Cl.
*H01L 21/223* (2006.01)
*H01L 21/225* (2006.01)
(Continued)

(52) U.S. Cl.
CPC ...... *H01L 21/2233* (2013.01); *H01L 21/2258* (2013.01); *H01L 31/184* (2013.01);
(Continued)

(58) Field of Classification Search
CPC ............ H01L 21/2233; H01L 21/2258; H01L 31/184; H01L 33/0095; H01L 33/025; H01L 33/06; H01L 33/20; H01L 33/30
See application file for complete search history.

(56) References Cited

U.S. PATENT DOCUMENTS

| 4,956,683 A | 9/1990 | Quintana |
| 5,089,438 A * | 2/1992 | Katz ................. H01L 21/28575 438/606 |

(Continued)

FOREIGN PATENT DOCUMENTS

| DE | 3437120 A1 | 4/1986 |
| DE | 68926656 T2 | 11/1996 |

(Continued)

OTHER PUBLICATIONS

International Search Report and Written Opinion in corresponding International Application No. PCT/EP2019/076733 dated Jan. 16, 2020, 11 pages.

*Primary Examiner* — Michael Lebentritt
(74) *Attorney, Agent, or Firm* — MH2 TECHNOLOGY LAW GROUP LLP

(57) ABSTRACT

The invention relates to a method for producing a semiconductor component comprising performing a plasma treatment of an exposed surface of a semiconductor material with halogens, and carrying out a diffusion method with dopants on the exposed surface.

20 Claims, 3 Drawing Sheets

(51) Int. Cl.
  *H01L 31/18* (2006.01)
  *H01L 33/00* (2010.01)
  *H01L 33/02* (2010.01)
  *H01L 33/06* (2010.01)
  *H01L 33/20* (2010.01)
  *H01L 33/30* (2010.01)

(52) U.S. Cl.
  CPC ........ *H01L 33/0095* (2013.01); *H01L 33/025* (2013.01); *H01L 33/06* (2013.01); *H01L 33/20* (2013.01); *H01L 33/30* (2013.01)

(56) References Cited

U.S. PATENT DOCUMENTS

| | | | |
|---|---|---|---|
| 5,338,394 A | | 8/1994 | Fathimulla et al. |
| 5,474,652 A | | 12/1995 | Henderson et al. |
| 5,620,924 A | | 4/1997 | Nakata et al. |
| 5,757,039 A | | 5/1998 | Delanry et al. |
| 11,613,808 B2 | * | 3/2023 | Zhao .................. H01J 37/32862 438/758 |
| 2007/0190711 A1 | * | 8/2007 | Luo .................. H01L 21/28202 438/585 |
| 2010/0048005 A1 | * | 2/2010 | Seebauer .......... H01L 21/26566 257/E21.334 |
| 2010/0051893 A1 | * | 3/2010 | Kim ..................... H10N 70/041 257/E47.001 |
| 2013/0065398 A1 | * | 3/2013 | Ohsawa .......... H01J 37/32238 438/714 |
| 2015/0021653 A1 | * | 1/2015 | Oya .................... H01L 33/0066 438/46 |
| 2018/0097145 A1 | | 4/2018 | Bour et al. |
| 2022/0254648 A1 | * | 8/2022 | Wang .................. H01L 21/3065 |

FOREIGN PATENT DOCUMENTS

| | | | | |
|---|---|---|---|---|
| DE | 69838288 T2 | | 5/2008 | |
| EP | 0464372 A2 | * | 5/1991 | |
| EP | 1160880 B1 | * | 7/2012 | ......... H01L 31/1828 |
| JP | 2000100798 A | * | 4/2000 | |
| JP | 2008227109 A | * | 9/2008 | |
| JP | 5629898 B2 | * | 11/2014 | |
| KR | 20120042971 A | * | 7/2010 | |
| TW | 202111806 A | * | 3/2021 | ......... H01L 21/02046 |
| WO | WO-0203427 A2 | * | 1/2002 | ......... C04B 41/0054 |
| WO | WO-2008038526 A1 | * | 4/2008 | ......... G03F 7/0035 |
| WO | WO-2014006878 A1 | * | 1/2014 | ......... C08F 220/28 |
| WO | WO-2017218286 A1 | * | 12/2017 | ......... C08G 77/045 |

\* cited by examiner

METHOD FOR PRODUCING A SEMICONDUCTOR COMPONENT COMPRISING PERFORMING A PLASMA TREATMENT, AND SEMICONDUCTOR COMPONENT

CROSS-REFERENCE TO RELATED APPLICATIONS

This patent application is a national stage entry from International Application No. PCT/EP2019/076733, filed on Oct. 2, 2019, published as International Publication No. WO 2020/070202 A1 on Apr. 9, 2020, and claims priority under 35 U.S.C. § 119 from German patent application 10 2018 124 576.9, filed Oct. 5, 2018, the entire contents of all of which are incorporated by reference herein.

BACKGROUND

This patent application claims the priority of German patent application DE 10 2018 124 576.9, the disclosure of which is hereby incorporated herein by reference.

In the production of semiconductor devices, doping processes, among other things, are performed to provide the required functionality. For example, such doping processes may include diffusion processes, for example, from the gas phase.

In general, attempts are being made to provide improved doping processes.

The present invention is based on the object of providing an improved method for producing a semiconductor device and an improved semiconductor device.

According to the present invention, the object is achieved by the method and the subject matter of the independent claims. Advantageous further developments are defined in the dependent claims.

SUMMARY

According to embodiments, a method for producing a semiconductor device comprises performing a plasma treatment of an exposed surface of a semiconductor material with halogens, and performing a diffusion process with dopants or foreign atoms on the exposed surface.

According to embodiments, the plasma treatment may be performed in such a manner that the exposed surface is substantially not etched.

For example, the dopants or foreign atoms may be diffused from the gas phase or from a solid.

The dopants may contain zinc. For example, the dopants may be produced by degrading or decomposing an organometallic precursor, for example, diethylzinc or dimethylzinc. The plasma treatment may be performed with fluorine or chlorine or bromine.

The semiconductor material may be a III-V compound semiconductor material. For example, the semiconductor material contains $In_xGa_yAl_{1-x-y}P$.

Quantum wells may be formed within the semiconductor material.

The method may further comprise performing an oxygen plasma treatment after performing the plasma treatment with halogens and before performing the diffusion process.

According to embodiments, the method further comprises forming a layer stack which includes a first semiconductor layer of a first conductivity type, a second semiconductor layer of a second conductivity type, and a quantum well structure between the first semiconductor layer and the second semiconductor layer.

The method may be performed in an area-selective manner by forming a diffusion mask. The diffusion mask may be used for the plasma treatment and the diffusion process.

In addition, according to embodiments, the layer stack may be patterned into a mesa. In this process, a central area of the mesa may be covered by the mask and a mesa edge may not be covered. The mesa patterning may take place before or after the plasma treatment and the diffusion step. For example, the mesa may be patterned after the plasma treatment and the diffusion process have been performed. In this process, a central area of the mesa may correspond to the first part of the surface of the layer stack. A mesa edge may correspond to the second part of the surface of the layer stack. As a result, the central part of the mesa is arranged in an area of the semiconductor layer stack in which plasma treatment and diffusion have not taken place. The area of the mesa edge was, however, subjected to a plasma treatment and diffusion.

Further embodiments relate to a semiconductor device that may be produced by the method described. The semiconductor device may be an optoelectronic semiconductor device.

BRIEF DESCRIPTION OF THE DRAWINGS

The accompanying drawings serve to provide an understanding of exemplary embodiments of the invention. The drawings illustrate exemplary embodiments and, together with the description, serve to explain them. Further exemplary embodiments and numerous of the intended advantages emerge directly from the following detailed description. The elements and structures shown in the drawings are not necessarily shown true to scale. Identical reference numerals refer to identical or corresponding elements and structures.

DETAILED DESCRIPTION

Figure 1A:
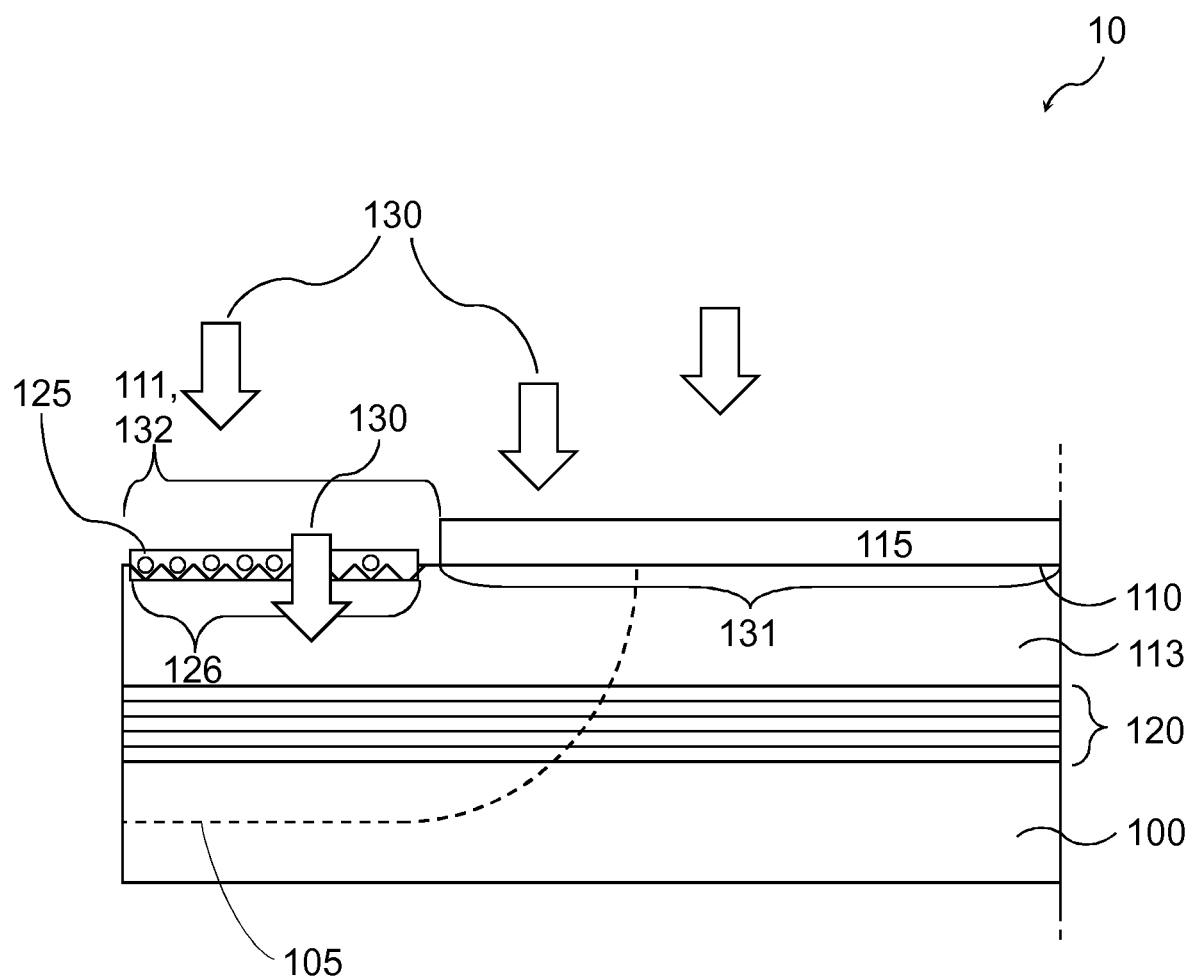
FIGS. 1A and 1B each show a workpiece for the production of a semiconductor device.

In the following detailed description, reference is made to the accompanying drawings, which form part of the disclosure, and in which specific exemplary embodiments are shown for purposes of illustration. In this context, directional terminology such as "top", "bottom", "front", "back", "over", "on", "in front of", "behind", "leading", "trailing", etc. refers to the orientation of the figures just described. Since the components of the exemplary embodiments may be positioned in different orientations, the directional terminology is only used for explanation and is not restrictive in any way.

The description of the exemplary embodiments is not restrictive, since also other exemplary embodiments exist and structural or logical changes may be made without deviating from the scope defined by the claims. In particular, elements of exemplary embodiments described in the following text may be combined with elements of other exemplary embodiments described, unless the context indicates otherwise.

The terms "wafer" and "semiconductor substrate" used in the following description may include any semiconductor-based structure that has a semiconductor surface. The wafer and structure are to be understood to include doped and undoped semiconductors, epitaxial semiconductor layers, possibly supported by a base, and further semiconductor structures. For example, a layer made of a first semiconductor material may be grown on a growth substrate made of a second semiconductor material or of an insulating material, for example, on a sapphire substrate. Depending on the intended use, the semiconductor may be based on a direct or an indirect semiconductor material. Examples of semiconductor materials particularly suited for generating electromagnetic radiation include, in particular, nitride semiconductor compounds through which, for example, ultraviolet, blue or longer-wave light may be generated, such as GaN, InGaN, AlN, AlGaN, AlGaInN, AlGaInBN, phosphide semiconductor compounds, through which, for example, green or longer-wave light may be generated, such as GaAsP, AlGaInP, GaP, AlGaP, as well as other semiconductor materials such as AlGaAs, SiC, ZnSe, GaAs, ZnO, $Ga_2O_3$, diamond, hexagonal BN, and combinations of the materials mentioned. The stoichiometric ratio of the compound semiconductor materials may vary. Further examples of semiconductor materials may include silicon, silicon germanium and germanium. In the context of the present description, the term "semiconductor" also includes organic semiconductor materials.

The term "substrate" generally includes insulating, conductive or semiconductor substrates.

The terms "lateral" and "horizontal", as used in this description, are intended to describe an orientation or alignment which runs essentially parallel to a first surface of a substrate or semiconductor body. This may, for example, be the surface of a wafer or a chip (die).

The horizontal direction may, for example, lie in a plane perpendicular to a direction of growth when layers are grown on.

The term "vertical", as used in this description, is intended to describe an orientation which is essentially perpendicular to the first surface of a substrate or semiconductor body. The vertical direction may, for example, correspond to a direction of growth when layers are grown on.

To the extent that the terms "have", "contain", "comprise", "include" and the like are used herein, they are open-ended terms that indicate the presence of said elements or features, but do not rule out the presence of other elements or features. The indefinite articles and the definite articles include both the plural and the singular, unless the context clearly indicates otherwise.

FIG. 1A shows a vertical cross-sectional view of a workpiece 10 when performing a method according to embodiments. The workpiece 10 comprises a semiconductor material 100. The semiconductor material 100 may, for example, be a III-V compound semiconductor material. The semiconductor material may, for example, contain a phosphide semiconductor material. For example, the semiconductor material 100 may comprise a material of the composition $In_xGa_yAl_{1-x-y}P$, where x and y may each assume values between 0 and 1. According to further embodiments, the III-V compound material may also be an arsenide compound semiconductor material. For example, the semiconductor material 100 may comprise a material of the composition $Al_xGa_{1-x}As$, where x may assume values between 0 and 1.

The semiconductor material 100 may include different layers or areas made of different materials.

According to embodiments, quantum well structures 120 may be arranged within the semiconductor material 100. The quantum well structures may be formed by arranging layers of a suitable band gap and layer thickness within the semiconductor material 100. The quantum well structures may, for example, have a single quantum well structure (SQW, single quantum well) or a multiple quantum well structure (MQW, multiple quantum well) for generating radiation, for example. In this process, the term "quantum well structure" has no meaning with regard to the dimensionality of the quantization. Thus, it includes, among other things, quantum wells, quantum wires and quantum dots, as well as any combination of these layers.

For example, a mask 115 may be formed over parts of a first main surface 110 of the semiconductor material 100. The mask 115 may, for example, cover a first part 131 of the surface of the semiconductor material 100. The mask 115 may further not cover a second part 132 of the surface of the semiconductor material 100, so that the second part 132 is exposed. The mask 115 may, for example, be a patterned hard mask layer, for example, made from silicon oxide, silicon nitride and other suitable materials. The patterned mask 115 may, however, also be a patterned uppermost layer of the first semiconductor layer 113, which is defined by means of a photoresist layer.

A method for producing a semiconductor device according to embodiments comprises performing a plasma treatment of an exposed surface portion 111 of a semiconductor material 100 with halogens. The exposed surface portion is substantially not etched by the plasma treatment. The exposed surface portion 111 corresponds to the second part 132 of the surface of the semiconductor material. The method further comprises performing a diffusion process 130 with dopants on the exposed surface.

Figure 2:
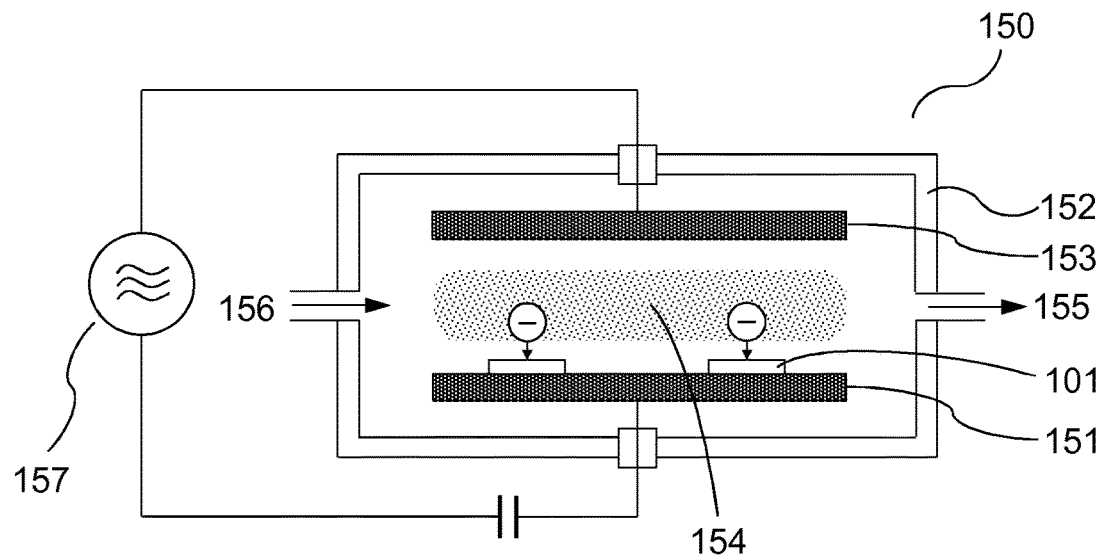
FIG. 2 illustrates an example of an apparatus in which the method according to embodiments may be performed.

The workpiece 10 shown in FIG. 1A is subjected to a plasma treatment, for example, by using the plasma reactor illustrated in FIG. 2. This plasma treatment modifies the exposed surface 111 of the semiconductor material 100, so that a modified surface 126 results. For example, this modification or conditioning produces a non-volatile compound 125 on the surface, which has a catalytic effect on the subsequent process for introducing atoms from the gas phase or from the solid phase. For example, a surface coverage with the process gas may form in the area of the modified surface 126, by which the subsequent process is catalyzed. The process parameters for the plasma treatment are selected such that a lowest possible removal rate of the semiconductor material is achieved for the adequate formation of the surface modification described. The removal rate is at least a factor of 10, for example, at least a factor of 100, lower than for conventional plasma etching processes with etching gases such as $BCl_3$, $Cl_2$ or $SiCl_4$. For example, the removal rate or etching rate may be less than 1 nm/sec. The term "substantially not etched" means that the removal rate of the semiconductor material is at least a factor of 10 lower than for these conventional plasma etching processes.

As has been found, the corresponding conditioning, i.e. the non-volatile compound 125 may also be retained on the modified surface 126 over a longer period of time. For example, this non-volatile compound 125 may be retained for several months, for example, half a year. The non-volatile compound 125 or conditioning may also survive cleaning in an oxygen plasma. For example, cleaning in an oxygen plasma to remove the photoresist layer used for patterning may be performed before a subsequent diffusion process is performed. Furthermore, the non-volatile compound 125 has sufficient stability at elevated temperatures, for example, temperatures greater than 500° C. or 520° C., which may occur during a diffusion process.

According to all the embodiments described herein, an identical mask 115 may be used for the plasma treatment and the diffusion process.

As a result of the plasma treatment with halogens, a diffusion process 130 for introducing dopants may be greatly accelerated. Furthermore, undesirable surface effects may be suppressed. This improves the homogeneity of the doping.

For example, the formation of the non-volatile compound 125 lowers the activation energy for the diffusion process, in which the atoms to be diffused are first degraded and subsequently penetrate the crystal lattice.

According to embodiments, the diffusion process may be performed from the gas phase. For example, a diffusion of zinc atoms may be performed. An organometallic precursor material may be used in this process. For example, diethylzinc or dimethylzinc may be provided as a gaseous precursor material. According to further embodiments, the diffusion process may be performed from the solid phase. For example, a suitable material such as a zinc compound may be vapor deposited on the exposed surface 111. The dopants are diffused into the semiconductor material 100 by a subsequent temperature treatment step. The result is the doped portion 105.

Figure 1B:
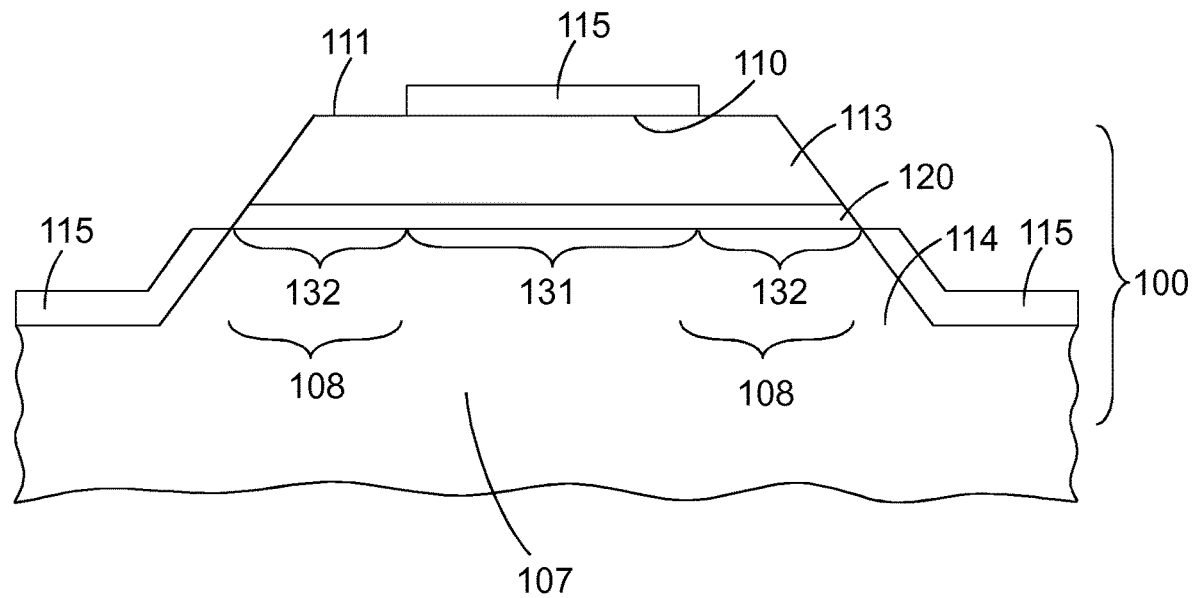

FIG. 1B shows a cross-sectional view of a workpiece when performing a method according to further embodiments. The semiconductor material 100 includes a first semiconductor layer 113 of a first conductivity type, for example, p-type, and a second semiconductor layer 114 of a second conductivity type, for example, n-type. A quantum well structure 120 as set out above is arranged between the first and second semiconductor layers 113, 114. For example, the quantum well structure 120 forms an active zone in which electromagnetic radiation may be generated.

The method according to embodiments as described above is performed. In particular, a plasma treatment of the exposed surface 111 of a semiconductor material 100 is performed with halogens. Furthermore, a diffusion process 130 is performed with dopants on the exposed surface 111.

In addition, the semiconductor layer stack, which includes the first, the second semiconductor layers and the quantum well structure, is patterned into a mesa 107. The mesa etching may take place before or after the diffusion step.

For example, the mesa etching may be performed in such a manner that a central area of the mesa, i.e. an area of the mesa which does not correspond to the mesa edge 108 and which, for example, may be enclosed by the mesa edge 108, is present in the area of the first part 131 of the surface of the layer stack. The mesa edge 108 is present in a second part 132 of the surface of the layer stack. Accordingly, the plasma treatment with halogens and a diffusion of zinc atoms or foreign atoms have taken place at the mesa edge 108 or will take place in a subsequent step. In the central area of the mesa, the plasma treatment with halogens and diffusion of zinc atoms have not taken place and will not take place in a possibly subsequent diffusion step.

If the mesa etching takes place after the plasma treatment has been performed, then, for example, the mask 115 may be placed and patterned in such a manner that the first part 131 of the surface of the layer stack is present at the position of a central area of the mesa 107 to be patterned later. Furthermore, the second part 132 of the surface is present at the edge 108 of the mesa to be patterned later.

If the mesa etching takes place before the plasma treatment is performed, then the mask layer 115 may be patterned in such a manner that a surface 111 of the semiconductor material 100 is exposed in the area of a mesa edge 108. A central area of the mesa 107 is covered with the mask layer 115. As a result, the plasma treatment and the diffusion process take place in an area of the mesa edge 108. The plasma treatment and the diffusion process do not take place in a central area of the mesa 107.

For example, a so-called intermixing of quantum wells may be brought about by diffusion of zinc atoms. In this process, the energy levels of the quantum wells 120 each shift at the mesa edge 108, as a result of which a lateral leakage of charge carriers at the mesa edge is prevented. As a result, a non-radiative surface recombination on the side flanks of the mesa may be prevented. Diffusion does not take place in a central area of the mesa. It has been found experimentally that, due to the plasma treatment being performed with halogens, a wavelength shift in the electromagnetic radiation may be achieved after a shorter diffusion time. The wavelength shift is achieved by the so-called intermixing of the quantum wells, i.e. the shift of the energy levels within the quantum wells as a result of diffusion of zinc atoms. In this process, the diffusion time may, for example, be reduced to less than 1/10 of the original value.

For example, an improved red LED may be produced by the method described.

FIG. 2 illustrates a plasma reactor 150 within which the method of a plasma treatment may be performed. A workpiece or semiconductor wafer 101 is, for example, placed on a lower electrode 151 within the plasma reactor. A suitable bias voltage may be applied between the lower electrode 151 and the upper electrode 153. The lower and upper electrodes 151, 153 are each arranged within a vacuum chamber 152. The vacuum chamber 152 may be evacuated via a vacuum pump 155. Treatment gases 156 may be introduced via an inlet. A high frequency generator 157 may be operated accordingly. In addition to the treatment gas 156, a carrier gas, for example, from an inert gas, may also be supplied. Furthermore, the temperature of the wafers or workpieces 10 may be set. The gas between the electrodes may be caused to glow discharge by an applied high frequency voltage. This creates a plasma with ions, electrons and excited neutral particles. Under appropriate process conditions, the incident ions strike the wafer surface and lead to a modification of the surface. Halogens such as fluorine, chlorine or bromine may, for example, be used as a reaction gas.

After this process has been performed, atoms from the gas phase or from the solid phase are introduced via diffusion, if necessary after a longer waiting time, so that doping of the semiconductor material takes place.

According to embodiments, a cleaning step is performed in an oxygen plasma before the diffusion process is performed. For example, the plasma treatment with halogens may be performed in a temperature range from room temperature to 200° C., for example, at a temperature less than 100° C. for a few seconds.

For example, arbitrary semiconductor devices may be produced for a wide variety of applications using the method described. For example, optoelectronic semiconductor devices based on a III-V compound semiconductor material may be produced by the method described.

Figure 3:
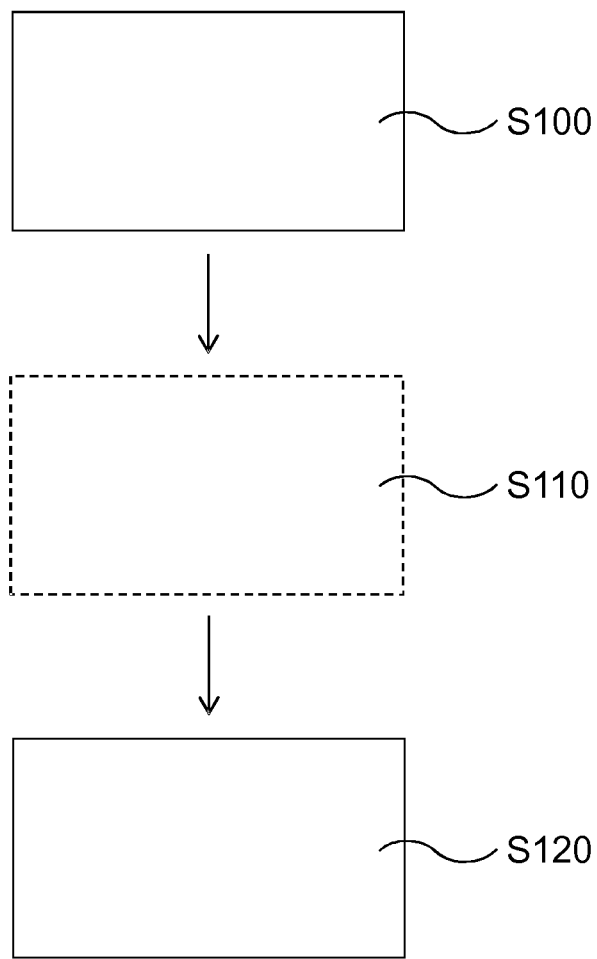
FIG. 3 illustrates a method according to embodiments.

FIG. 3 summarizes a method according to embodiments. The method comprises performing (S100) a plasma treatment of an exposed surface of a semiconductor material with halogens and performing a diffusion process (S120) with dopants on the exposed surface. According to embodiments, the method may further comprise a cleaning step in an oxygen plasma (S110). This cleaning step (S110) is performed after performing the plasma treatment (S100) and before performing the diffusion process (S120).

Although specific embodiments have been illustrated and described herein, persons skilled in the art will recognize that the specific embodiments shown and described may be replaced by a multitude of alternative and/or equivalent embodiments without departing from the scope of the invention. The application is intended to cover any adaptations or variations of the specific embodiments discussed herein. Therefore, the invention is to be limited only by the claims and their equivalents.

The invention claimed is:

1. A method for producing a semiconductor device, comprising:
    performing a plasma treatment of an exposed surface of a semiconductor material with halogens, with the exposed surface being substantially not etched by the plasma treatment;
    performing an oxygen plasma treatment after performing the plasma treatment with halogens; and
    performing a diffusion process with dopants on the exposed surface after performing the oxygen plasma treatment.

2. The method according to claim 1, wherein the dopants are diffused from the gas phase.

3. The method according to claim 1, wherein the dopants are diffused from a solid.

4. The method according to claim 2, wherein the dopants contain zinc.

5. The method according to claim 2, wherein the dopants are produced by degrading an organometallic precursor.

6. The method according to claim 5, wherein the organometallic precursor comprises diethylzinc or dimethylzinc.

7. The method according to claim 1, wherein the plasma treatment is performed with fluorine.

8. The method according to claim 1, wherein the plasma treatment is performed with chlorine.

9. The method according to claim 1, wherein the plasma treatment is performed with bromine.

10. The method according to claim 1, wherein the semiconductor material is a III-V compound semiconductor material.

11. The method according to claim 9, wherein the semiconductor material contains $In_xGa_yAl_{1-x-y}P$, with $0 \leq x \leq 1$ and $x+y \leq 1$.

12. The method according to claim 1, wherein quantum wells are formed within the semiconductor material.

13. The method according to claim 1, wherein the semiconductor device is an optoelectronic semiconductor device.

14. The method according to claim 1, further comprising:
    forming a layer stack which includes a first semiconductor layer of a first conductivity type, a second semiconductor layer of a second conductivity type, and a quantum well structure between the first semiconductor layer and the second semiconductor layer,
    wherein a mask is formed over a surface of the layer stack.

15. The method according to claim 14, wherein the mask covers the first part of the surface of the layer stack during the plasma treatment and during the diffusion process.

16. The method according to claim 14, further comprising:
    patterning the layer stack to form a mesa.

17. The method according to claim 16, wherein the mesa is patterned after performing the plasma treatment and the diffusion process, with a central area of the mesa corresponding to the first part of the surface of the layer stack and a mesa edge corresponding to the second part of the surface of the layer stack.

18. A method for producing a semiconductor device, the method comprising:
    forming a mask over a surface of a semiconductor material so that a first part of the surface of the semiconductor material is covered and a second part of the surface of the semiconductor material is not covered;
    performing a plasma treatment of the second part of the surface of the semiconductor material with halogens with the second part of the surface being substantially not etched by the plasma treatment; and
    performing a diffusion process with dopants on the second part of the surface.

19. A semiconductor device produced by the method according to claim 18.

20. The semiconductor device according to claim 19, wherein the semiconductor device is an optoelectronic semiconductor device.

* * * * *